(12) United States Patent
Mhibik et al.

(10) Patent No.: US 11,848,394 B2
(45) Date of Patent: Dec. 19, 2023

(54) PHOTOVOLTAIC MODULE AND FLEXIBLE SATELLITE SOLAR GENERATOR

(71) Applicant: AIRBUS DEFENCE AND SPACE SAS, Toulouse (FR)

(72) Inventors: Oumaima Mhibik, Toulouse (FR); Dominique Vergnet, Toulouse (FR)

(73) Assignee: AIRBUS DEFENCE AND SPACE SAS, Toulouse (FR)

( * ) Notice: Subject to any disclaimer, the term of this patent is extended or adjusted under 35 U.S.C. 154(b) by 0 days.

(21) Appl. No.: 17/787,181

(22) PCT Filed: Dec. 10, 2020

(86) PCT No.: PCT/FR2020/052373
§ 371 (c)(1),
(2) Date: Jun. 17, 2022

(87) PCT Pub. No.: WO2021/123575
PCT Pub. Date: Jun. 24, 2021

(65) Prior Publication Data
US 2023/0021466 A1  Jan. 26, 2023

(30) Foreign Application Priority Data
Dec. 19, 2019 (FR) ..................... 1914823

(51) Int. Cl.
*H01L 31/05* (2014.01)
*H02S 30/20* (2014.01)
*H01L 31/048* (2014.01)

(52) U.S. Cl.
CPC ............ *H01L 31/05* (2013.01); *H01L 31/048* (2013.01); *H02S 30/20* (2014.12)

(58) Field of Classification Search
CPC ..... Y02E 10/50; H01L 31/05; H01L 31/0504; H01L 31/048; H05K 1/118; H05K 1/189;
(Continued)

(56) References Cited

U.S. PATENT DOCUMENTS

| 4,043,834 A | 8/1977 | Rüsch |
| 8,683,755 B1 | 4/2014 | Spence et al. |

(Continued)

FOREIGN PATENT DOCUMENTS

| CN | 109067346 | 12/2018 |
| EP | 1 548 847 | 6/2005 |

(Continued)

OTHER PUBLICATIONS

French International Search Report with English translation for PCT/FR2020/052373, dated Apr. 21, 2021 (7 pages).
(Continued)

*Primary Examiner* — Mayla Gonzalez Ramos
(74) *Attorney, Agent, or Firm* — Nixon & Vanderhye P.C.

(57) ABSTRACT

A photovoltaic module for a satellite solar generator, and a flexible satellite solar generator are disclosed including a module having a printed circuit board comprising a substrate made of an insulating material and conductive traces, at least two chains of photovoltaic cells mounted on the face of the substrate supporting the electrically conductive traces and which are connected to the traces such that the traces establish an electrical connection between the chains of cells, and a protective layer that is optically transparent within a range of wavelengths corresponding to the cells' range of photovoltaic conversion, the layer being attached to the printed circuit board so as to cover at least all of the photovoltaic cells and all of the electrically conductive traces of the printed circuit board.

12 Claims, 4 Drawing Sheets

(58) Field of Classification Search
CPC .. H05K 2201/10143; B64G 1/10; B64G 1/44; B64G 1/443; H02S 30/20; H02S 40/34
See application file for complete search history.

(56) References Cited

U.S. PATENT DOCUMENTS

| | | | |
|---|---|---|---|
| 10,014,817 B2 | 7/2018 | Boulanger et al. | |
| 2009/0301544 A1* | 12/2009 | Minelli | H05K 1/189 257/E31.119 |
| 2010/0116325 A1* | 5/2010 | Nikoonahad | H01L 31/0504 136/251 |
| 2013/0008483 A1* | 1/2013 | Chaney | H02S 40/34 156/247 |
| 2017/0093326 A1 | 3/2017 | Boulanger et al. | |
| 2018/0020536 A1 | 1/2018 | Defigueiredo et al. | |

FOREIGN PATENT DOCUMENTS

| | | |
|---|---|---|
| EP | 2 746 164 | 6/2014 |
| FR | 2596356 | 10/1987 |
| FR | 3 081 614 | 11/2019 |
| WO | 2017/019308 | 2/2017 |

OTHER PUBLICATIONS

French Written Opinion of the ISA for PCT/FR2020/052373 dated Apr. 21, 2021 (5 pages).

Kerslake T. et al., "Off-Nominal Performance of the International Space Station Solar Array Wings Under Orbital Eclipse Lighting Scenarios", prepared for the Third International Energy Conversion Engineering Conference sponsored by the American Institute of Aeronautics and Astronautics San Francisco, California, Aug. 15-18, 2005, 57 pages, Oct. 1, 2005.

Hallinan G. et al., "Space Station WP-04 Power System Final Study Report DR-15", NASA, vol. 2 Study Results, prepared for National Aeronautics and Space Administration, Lewis Research Center, 556 pages, Jan. 19, 1987.

Labus T. et al., "Space Station Electrical Power System" NASA Technical Memorandum, prepared for the 38th International Astronautical Federation Congress Brighton, United Kingdom, 19 pages, Oct. 10-17, 1987.

Gerlach L. et al., "The Design Of The L-Sat Solar Array", Proc. 3rd European Symposium "Photovoltaic Generators in Space", pp. 241-255, Bath, May 4-6, 1982.

Gerlach L. et al., "Hubble Space Telescope Solar Generator Design For A Decade In Orbit", IEEE, pp. 1308-1313, Jan. 1, 1990.

Wrosch M. et al., "Laminated Solar Panels For Space Using Multi-Cell Transparent Covers", IEEE, pp. 2809-2811, Jan. 1, 2013.

Carey P. et al., "A Solar Array Module Fabrication Process For HALE Solar Electric UAVs", Lawrence Livermore National Laboratory, 4 pages, Mar. 21, 1994.

Zuckermandel W. et al., "Design, Build and Testing of TacSat Thin Film Solar Array", MicroSat Systems, Inc., 20th Annual AIAA/ USU Conference on Small Satellites, pp. 1-13, Jun. 29, 2006.

Minow J., et al., "Evidence for Arcing on the International Space Station Solar Arrays", Proceedings of the 15th Spacecraft Charging Technology Conference, pp. 1-8, Jun. 25, 2018.

Baraona C.R. et al., "Photovoltaic Power For Space Station Freedom", NASA Technical Memorandum 102569, Prepared for the Twenty-first Photovoltaic Specialists Conference Sponsored by the Institute of Electrical and Electronics Engineers, Orlando, Florida, 10 pages, May 21-25, 1990.

Tatro C. et al., "Space Station Photovoltaic Power Modules", NASA, The Space Congress Proceedings, 1988 (25th) Heritage, Dedication, Vision, 14 pages, Apr. 1, 1988.

Notification of Opposition for Application No. EP20842283.2, 69 pages, dated Oct. 21, 2022.

* cited by examiner

PHOTOVOLTAIC MODULE AND FLEXIBLE SATELLITE SOLAR GENERATOR

CROSS REFERENCE TO RELATED APPLICATIONS

The present application is a National Phase of International Application Number PCT/FR2020/052373, filed Dec. 10, 2020, which designated the U.S. and claims priority benefits from French Application Number FR1914823, filed Dec. 19, 2019, the entire contents of each of which are hereby incorporated by reference.

TECHNICAL FIELD

This application relates to a photovoltaic module, a flexible satellite solar generator comprising such a module, and a satellite comprising at least one flexible solar generator. The invention also relates to a method for manufacturing a photovoltaic module.

PRIOR ART

In a general trend of reducing satellite costs, efforts are currently underway to develop highly compact satellites in order to be able to house several satellites within the same launcher fairing and thus share the launcher to launch multiple satellites.

In particular, the solar generators of a satellite are components located outside the main body of the satellite, and for this reason there is a strong need for increasingly compact solutions.

In this context, flexible solar generators have been proposed, for example foldable or rollable, comprising a flexible substrate and photovoltaic cells attached to the flexible substrate.

In the solutions of the prior art, the photovoltaic cells may be connected to each other and to the satellite by wire harnesses, but these wire harnesses are generally bulky because the wires used must be able to deliver high power levels to the satellite, which can reach around 15 kW.

In other solutions, such as in U.S. Pat. Nos. 4,043,834 and 10,014,817, the wire harnesses are replaced by electrically conductive traces arranged on or in the flexible supports.

However, these prior art solutions are not without disadvantages. On the one hand, the use of electrically conductive traces on a surface of the flexible substrate exposes these traces to atomic oxygen present in space or ions generated by the photovoltaic cells' production of electricity, which causes erosion of these traces and therefore prevents the production of high voltage. The traces are also exposed to the electromagnetic radiation present in space and which can generate electrostatic discharges. The solar cells are protected from this radiation by protective glass covering each cell.

And even when the traces are embedded in the flexible substrate, which gives the traces some protection, in particular against erosion, the connection between the traces is not protected.

In addition, these solutions have the additional disadvantage of not being modular, since, as the electrical traces are created in the flexible substrate on which the photovoltaic cells are mounted, it is not possible to easily adjust the design of the solar generator, for example to modulate the nominal power that can be produced according to the needs of the satellite on which the solar generator is to be mounted.

SUMMARY

The invention improves the situation.

In particular, an object of the invention is to provide a solar generator of a satellite that is more reliable because it has better protection against the electromagnetic radiation present in space, and against the oxygen and ions which may also be present in space.

Another object of the invention is to provide a solar generator whose design is more easily adjustable to the needs of the satellite on which the generator is to be mounted, and which is simpler and less expensive to produce.

A solar generator of a satellite is thus proposed according to claim 1. In one embodiment, the electrically insulating substrate of each module is flexible.

In one embodiment, each photovoltaic module further comprises a layer of adhesive material extending between the photovoltaic cells and the substrate, and a layer of adhesive material extending between the protective layer and the photovoltaic cells.

In one embodiment, the electrically conductive traces of each module are configured to establish a serial connection between the chains of cells.

In one embodiment, the electrically insulating flexible substrate of the solar generator is foldable along a plurality of parallel fold lines, each module being attached to the flexible substrate between two fold lines.

In one embodiment, each module is attached to the flexible substrate of the solar generator such that each chain of photovoltaic cells extends in parallel to the fold lines.

In one embodiment, the flexible substrate has, between two opposite ends, a main dimension extending in a direction orthogonal to the fold lines, the solar generator further comprises first and second deployment plates respectively connected to the opposite ends of the flexible substrate, and a deployment member suitable for selectively moving the two deployment plates closer together or further apart, the solar generator being suitable for assuming a folded configuration in which the flexible substrate is folded along the fold lines between the two deployment plates, and a deployed configuration in which the flexible substrate extends substantially flat between the two deployment plates, said plates being apart from each other, and the connection device is integrated into one of the deployment plates.

In one embodiment, the solar generator comprises a printed circuit board comprising the flexible substrate and a plurality of electrically conductive traces arranged on said face of the flexible substrate or in the flexible substrate.

In one embodiment, at least two of the electrically conductive traces comprise a first end suitable for connection to the connection device, a second end connected to a chain of cells, and an intermediate portion extending between the ends, all of the intermediate portions of the traces extending in parallel along the main dimension of the solar generator.

In one embodiment, the solar generator further comprises a spacer attached to the flexible substrate and adjacent to each photovoltaic module, the spacer projecting from the flexible substrate to a greater height relative to said flexible substrate than the height of a photovoltaic module.

This disclosure also relates to a satellite comprising at least one solar generator according to the above description.

This disclosure also relates to a method for manufacturing a satellite solar generator according to claim 11.

In one embodiment of the method, the connection step is implemented by electric or ultrasonic welding.

The solar generator according to this disclosure has increased protection for the cells, for the conductive traces of the printed circuit board, as well as for the connections between the traces and the photovoltaic cells, due to the use of a common protective layer which covers the traces and the cells and which also makes it possible to remove a cell's individual protection. This also makes it possible to increase the nominal operating voltage of the module, while lightening the structure.

The use of a common protective layer also makes it possible to stiffen the module by stiffening in particular the gaps between the cells.

In addition, the proposed module can easily be mounted on a flexible substrate in order to form a flexible solar generator whose design can be adjusted according to the number of modules mounted on the substrate.

In one embodiment, the flexible substrate also supports conductive traces that can be connected to the chains of photovoltaic cells of the modules, in order to connect these chains in parallel. As a result, the flexible substrate therefore constitutes a mechanical substrate as well as contributing to the electrical connection between the chains of cells on the one hand and the satellite on the other. It is then sufficient to attach the modules onto the flexible substrate and to connect the chains to the electrically conductive traces of the flexible substrate in order to obtain a solar generator which can be connected to the satellite. This allows simplifying the manufacturing process of the solar generator and reducing its cost.

BRIEF DESCRIPTION OF DRAWINGS

Other features, details, and advantages will become apparent upon reading the detailed description below, and upon analyzing the appended drawings, in which.

DESCRIPTION OF EMBODIMENTS

Photovoltaic Module

Figure 1A:
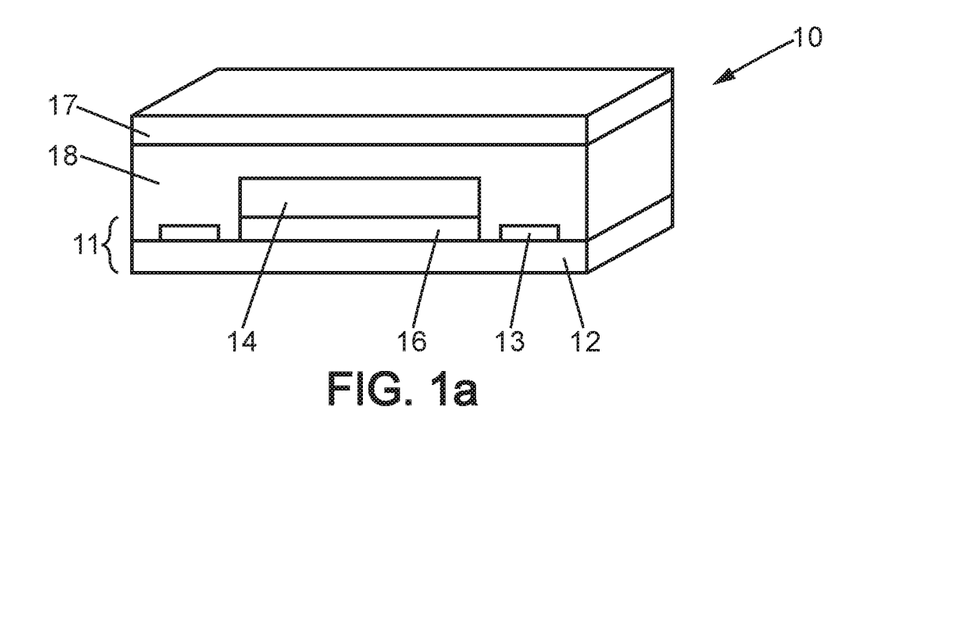
FIG. 1a schematically represents a sectional view of a module according to one embodiment.

With reference to [FIG. 1a] and [FIG. 1b], a photovoltaic module 10 for a satellite solar generator will now be described. [FIG. 1a] shows a sectional view of a module, while [FIG. 1b] shows a top view of a module.

The module 10 comprises a printed circuit board 11 (also referred to by the acronym PCB), comprising at least one substrate 12 made of an electrically insulating material, and electrically conductive traces 13 arranged on at least one face of the substrate.

In one embodiment, the substrate 12 is rigid. It may for example be implemented as a rigid honeycomb. According to a more advantageous variant, the substrate 12 is flexible, and may be formed of a film of polyimide, for example marketed under the trade name Kapton, or of PEEK.

In one embodiment, the printed circuit board 11 may be multilayered, meaning that the substrate 12 comprises several superposed layers of insulating material, and additional conductive traces arranged between two successive layers of insulating material. The electrically conductive traces are typically made of metal, for example copper, and may in some cases have a treatment, silver plating for example.

The module 10 further comprises at least two chains 14 of photovoltaic cells 15 attached to the face of the printed circuit board 10 on which the conductive traces are arranged. The chains 14 of cells are preferably bonded to the printed circuit board 10 by means of a layer 16 of adhesive material, for example an adhesive material based on silicone or acrylic.

Figure 1B:
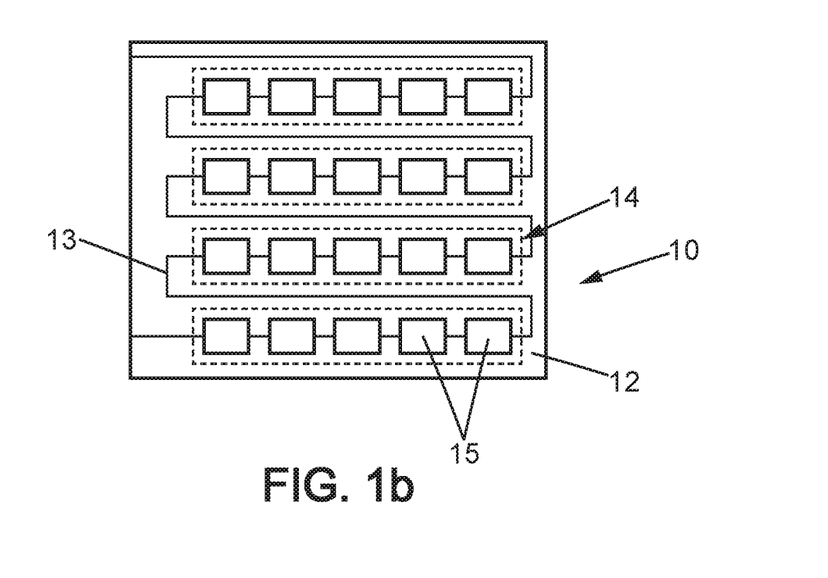
FIG. 1b schematically represents a top view of a module according to one embodiment.

As is schematically represented in [FIG. 1b], all the chains 14 of photovoltaic cells in a module are preferably arranged parallel to each other.

Each chain 14 comprises a plurality of photovoltaic cells 15 connected to each other in series. According to one non-limiting example, the cells 15 of a chain of cells are InGaP/GaAs/InGaAs triple junction cells, this type of cell having the advantage of low cost, good photovoltaic conversion efficiency, and a good power-to-weight ratio.

In addition, each chain 14 of photovoltaic cells is connected to the conductive traces 13 arranged on the face of the printed circuit board 10, such that the conductive traces establish an electrical connection between the chains of cells. The electrical connection between the chains is preferably a serial connection. Alternatively, this connection may be parallel. According to yet another alternative, in the case where the printed circuit board is of the type with multiple layers comprising additional conductive traces arranged between two layers of electrically insulating material, both types of connection may be carried out between the cells, depending on the performance expected for the module and more generally for the solar generator comprising this module. In yet another alternative, the conductive traces 13 are suitable for serially connecting the chains 14 of cells of the module, and the module may comprise on the rear face, meaning on the face of the insulating substrate 12 opposite to the conductive traces 13 and to the chains 14 of cells, additional conductive traces allowing a parallel connection of chains of cells.

The electrical connection between a cell in a chain of cells and a conductive trace of the printed circuit board is advantageously made by means of a connection tab which is soldered to a connector of the cell and to the conductive trace, for example by electric or ultrasonic welding.

Finally, the module 10 comprises a protective layer 17, suitable for protecting the cells 15, the conductive traces 13, and the electrical connections between them against radiation, atomic oxygen, or the ions present in space (for example generated by the module's production of electricity), and also against electrostatic discharges. However, the protective layer 17 is transparent within a range of wavelengths corresponding to the cells' range of photovoltaic conversion, so as not to reduce the module's performance in producing electricity.

The protective layer 17 may be a panel or a single film covering all the chains 14 of photovoltaic cells, as well as the conductive traces 13 and the connections between the traces and cells. In one particular embodiment, the protective layer 17 may cover the entire surface of the module.

The protective layer is advantageously made of transparent glass.

The use of a single protective layer common to all the cells allows the use of cells 15 that do not have individual protective glass, which makes the cells less heavy and less expensive. The protective layer 17 is advantageously bonded to the printed circuit board and the chains of cells, by a layer 18 of additional adhesive material, then the assembly is laminated as described in more detail below in order to cure the adhesive and secure the entire module together.

Figure 5:
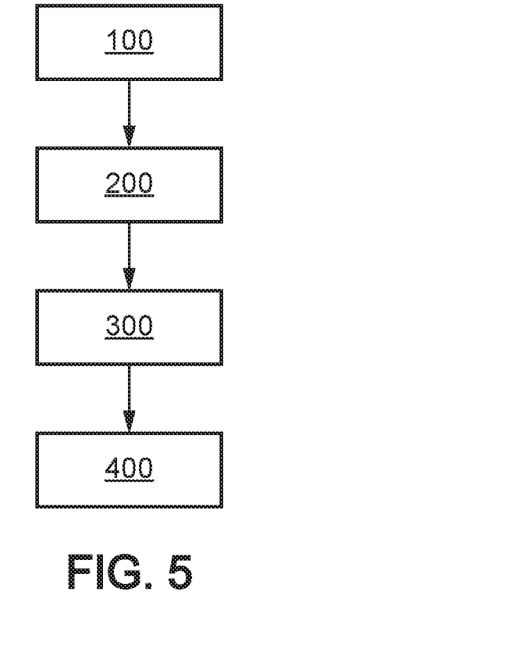
FIG. 5 schematically represents the main steps of a method for manufacturing a module according to one embodiment.

With reference to [FIG. 5], the main steps of a method for manufacturing the module described above are schematically represented.

The method comprises a first step 100 of bonding the chains 14 of photovoltaic cells on the same face of the printed circuit board as the one on which the conductive traces 13 are created. This bonding is done by means of the first layer 16 of adhesive material.

The chains 14 of cells are then connected to the conductive traces 13 of the printed circuit board during a step 200, for example by adding connection tabs and soldering these tabs to a conductive trace 13 and to a connector of an end cell in a chain, by electric or ultrasonic welding.

The method then comprises a step 300 of bonding the protective layer 17 to the printed circuit board supporting the chains of cells, by means of the second layer 18 of adhesive material. The protective layer 17 is then positioned so as to cover all the cells, the conductive traces, and the connections between the traces and cells.

Finally, the method comprises a step 400 of laminating the assembly, during which the module is placed under vacuum and at high temperature (approximately 80° C.) in order to fix all components of the module. The presence of a common protective layer 17 for the entire module makes this implementation step simpler than if the cells included an individual protective layer. This makes it possible to reduce the time to integrate the modules.

Flexible Solar Generator

Figure 2A:
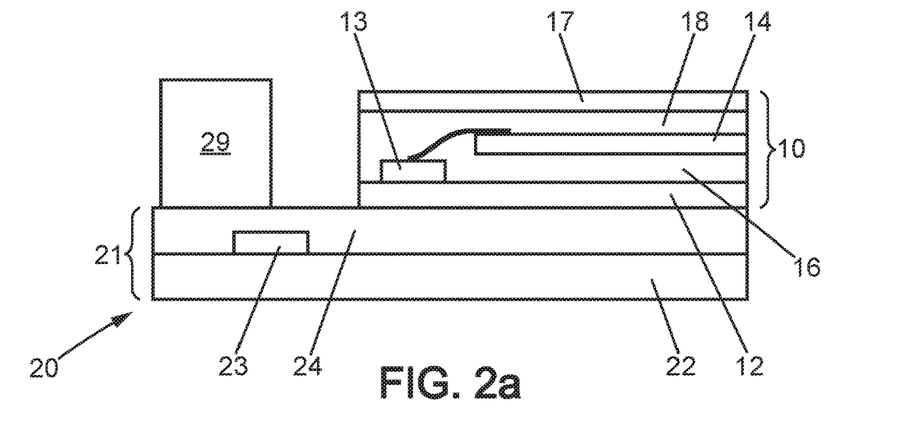
FIG. 2a schematically represents a sectional view of a module attached to a flexible substrate according to one embodiment.
Figure 2B:
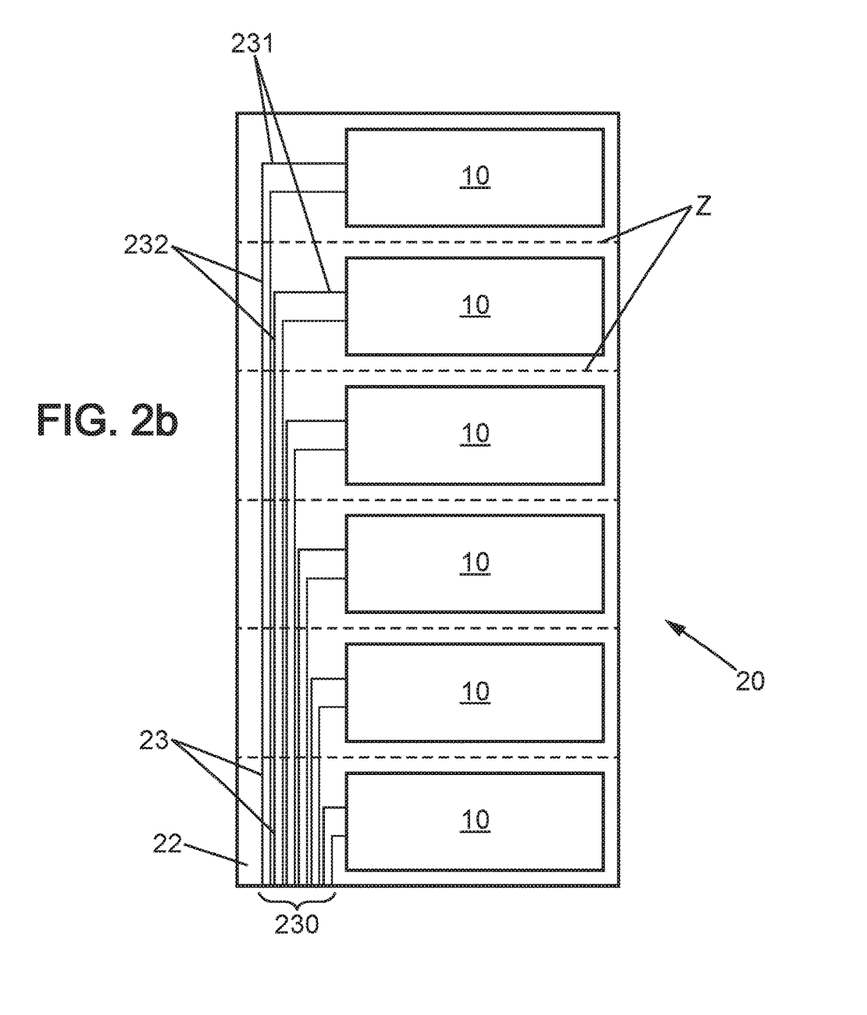
FIG. 2b schematically represents a top view of modules attached to a flexible substrate according to one embodiment.

With reference to [FIG. 2a] and [FIG. 2b], a flexible satellite solar generator 20 comprising at least one module 10 according to the above description will now be described. The solar generator is suitable for generating between 1 and 18 kW of power depending on the intended application of the satellite and its orbit, with a power-to-weight ratio of more than 200 W/kg.

The solar generator 20 comprises an electrically insulating flexible substrate 22, which is for example a film of polyimide or of PEEK. In a preferred embodiment, the solar generator comprises a flexible printed circuit board 21, comprising the flexible substrate 22, and conductive traces 23 created on one face of the flexible substrate 22 or in the flexible substrate 22. In the latter case, the flexible substrate comprises at least two layers of electrically insulating material and the conductive traces are created between the layers.

The solar generator 20 further comprises at least two modules 10 according to the above description, attached to the flexible substrate 22. Advantageously, the modules 10 are bonded to the flexible substrate 22 by an adhesive layer 24, the selected adhesive preferably being an adhesive based on silicone or epoxy. Depending on the arrangement of the conductive traces on or in the flexible substrate 22, the module(s) may occupy all or part of the surface of the flexible substrate 22.

The flexible substrate 22 of the solar generator 20 makes it possible to create the mechanical connection between the modules. In addition, the conductive traces 23 may be arranged to connect the various modules to the satellite in parallel, and/or to connect at least two modules to each other in series. Advantageously, the conductive traces 23 comprise at least first conductive traces enabling a connection of one or more modules to the satellite, and in some cases they may also comprise second conductive traces enabling the interconnection of several modules in series.

The solar generator 20 finally comprises a connection device 25, suitable for establishing a connection between the modules 10 on the one hand, and/or for connecting the modules to the satellite on the other hand.

In one embodiment, the connection device 25 may be a wire harness which is connected to the satellite on the one hand, and to one or more module(s) on the other hand.

In a more advantageous embodiment, the solar generator 20 comprising a printed circuit board 21 comprising electrically conductive traces 23, the connection device 25 is advantageously an electrical circuit suitable for grouping together the electrically conductive traces and connecting them in parallel. In this case, and as represented for example in [FIG. 2b], electrically conductive traces of the printed circuit board may be arranged on a same side of the flexible substrate, each conductive trace 23 comprising a first end 230 suitable for connection to the connection device 25 in order to then be connected to the satellite, a second end 231 connected to a chain of cells of a module, and a rectilinear intermediate portion 232 extending between the ends, all of the intermediate portions 232 of the traces extending in parallel in the main dimension of the solar generator, along said side of the flexible substrate 22, and on a same side of the modules 10 attached to the flexible substrate.

Preferably, the connection device 25 also comprises a blocking diode respectively associated with each module, meaning, in the above example, associated with each electrically conductive trace of the printed circuit board 21.

Figure 3:
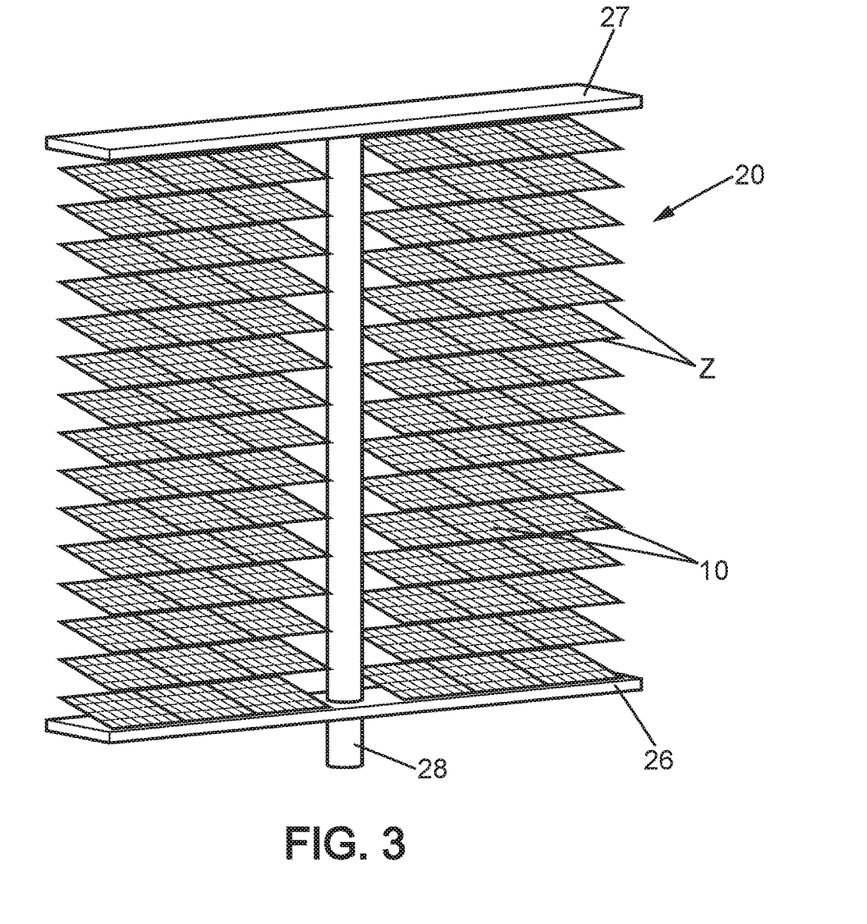
FIG. 3 schematically represents a solar generator according to one embodiment.

With reference to [FIG. 3], in a preferred embodiment, the flexible substrate 22, and where appropriate the printed circuit board 21 as a whole, is foldable along a plurality of fold lines Z, preferably parallel to each other, and preferably separated by a constant distance. The modules 10 are attached to the flexible substrate 22 between two fold lines Z. The solar generator 20 then preferably has a main dimension in a direction perpendicular to the fold lines.

This makes it possible, whether or not the modules are rigid, to obtain a flexible solar generator which can assume a folded configuration where it is folded along each fold line, for the launch of the satellite on which the generator 20 is mounted, and a deployed configuration when the satellite is in orbit, in order to be able to supply the satellite with electricity.

In the example shown in this figure, the flexible substrate may comprise conductive traces for the serial connection of the modules arranged between two same fold lines of the flexible substrate, and other conductive traces for the parallel connection to the satellite of each group of modules arranged between two same fold lines of the flexible substrate.

In the embodiment described above with reference to [FIG. 2b], where the solar generator comprises a printed circuit board in which the traces have intermediate portions extending parallel to each other along one side of the flexible substrate, the modules are advantageously positioned on the flexible substrate 22 so that each chain of photovoltaic cells extends in parallel to the fold lines, the fold lines themselves being perpendicular to the parallel intermediate portions of the conductive traces.

Figure 4:
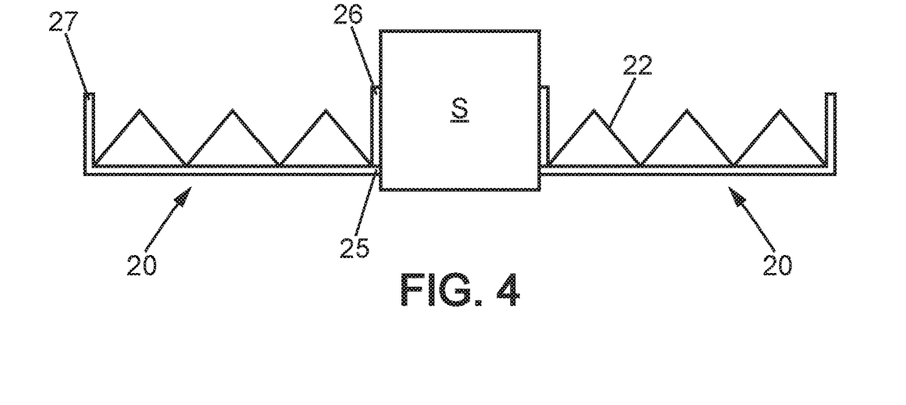
FIG. 4 schematically represents a satellite comprising two solar generators.

With reference to [FIG. 4], in order to allow deploying the solar generator and maintaining it in the deployed configuration, the generator advantageously comprises a rigid support in the form of first 26 and second 27 deployment plates, respectively connected to the opposite ends of the flexible substrate, said ends being the ends between which the flexible substrate extends along its main dimension.

In addition, the solar generator comprises a deployment member 28 connected to the two deployment plates 26, 27, making it possible to selectively move the deployment plates further apart or closer together. The deployment member may for example be a telescoping mast, as schematically represented in [FIG. 4].

In this embodiment, the device 25 for connection to the satellite is advantageously integrated into the deployment plate 26 located at the end of the solar generator closest to the module, this deployment plate 26 advantageously being integrally mounted on a satellite wall.

In this example, the folded configuration of the solar generator is therefore a configuration in which the two plates 26, 27 are moved closer to each other, the flexible substrate supporting the modules being folded between the plates, and the deployed configuration is a configuration in which the two plates 26, 27 are spaced from each other, and the flexible substrate supporting the modules extends between the plates in a substantially flat manner.

Referring to [FIG. 4], a satellite S is represented comprising two solar generators 20 according to the above description, each solar generator having an intermediate configuration between the folded configuration and the deployed configuration. It is understood that the deployed configuration is obtained by moving the plates 27 further apart from the main body of the satellite.

Returning to [FIG. 2a], the solar generator 20 advantageously comprises spacers 29, which are attached to the flexible substrate 22 so that they are adjacent to the modules 10, and which have a greater height measured in relation to the flexible substrate 22 than the height of a module. These spacers make it possible to define the minimum distance between two successive portions of the flexible substrate 22 once folded, and therefore make it possible to protect the modules against excessive pressure applied during folding of the substrate. Advantageously, the spacers 29 are made of blocks of Kapton or fiberglass/epoxy.

However, the configuration shown in [FIG. 3] and [FIG. 4] is not limiting, and it is conceivable that the flexible generator is foldable according to other configurations, or is rollable rather than foldable. In the latter case, it does not have fold lines, the printed circuit board used for the modules must also be flexible, and the thickness of the protective layer for the modules must be reduced in order to impart the necessary flexibility to this protective layer.

The invention claimed is:

1. A solar generator of a satellite, comprising:
    a first printed circuit board comprising an electrically insulating flexible first substrate and a plurality of first electrically conductive traces arranged on a face of the insulating flexible first substrate or in the insulating flexible first substrate,
    at least two photovoltaic modules, attached to a face of the insulating flexible first substrate, and
    a connection device suitable for establishing a connection between at least some of the at least two photovoltaic modules and/or for connecting the at least two photovoltaic modules to the satellite,
    wherein each of the at least two photovoltaic modules comprises:
        a second printed circuit board comprising at least one second substrate made of an electrically insulating material, and second electrically conductive traces arranged on at least one face of the at least one second substrate,
        at least two chains of photovoltaic cells, each chain comprising a plurality of photovoltaic cells connected in series, the chains of photovoltaic cells being mounted on the face of the at least one second substrate supporting the second electrically conductive traces and the chains being connected to said second traces such that said second traces establish an electrical connection between the chains of cells,
        a protective layer that is optically transparent within a range of wavelengths corresponding to the cell's range of photovoltaic conversion, the protective layer being attached to the second printed circuit board so as to cover at least all of the photovoltaic cells and all of the second electrically conductive traces of the second printed circuit board.

2. The solar generator according to claim 1, wherein the electrically insulating second substrate of each module is flexible.

3. The solar generator according to claim 1, wherein each module further comprises a layer of adhesive material extending between the photovoltaic cells and the second substrate, and a layer of adhesive material extending between the protective layer and the photovoltaic cells.

4. The solar generator according to claim 1, wherein the second electrically conductive traces are configured to establish a serial connection between the chains of cells.

5. The solar generator according to claim 1, wherein the electrically insulating flexible first substrate is foldable along a plurality of parallel fold lines, each module being attached to the flexible first substrate between two fold lines.

6. The solar generator according to claim 5, wherein each module is attached to the flexible first substrate such that each chain of photovoltaic cells extends in parallel to the fold lines.

7. The solar generator according to claim 5, wherein the flexible first substrate has, between two opposite ends, a main dimension extending in a direction orthogonal to the fold lines,
    the solar generator further comprises first and second deployment plates respectively connected to the opposite ends of the flexible first substrate, and a deployment member suitable for selectively moving the two deployment plates closer together or further apart,
    the solar generator being suitable for assuming a folded configuration in which the flexible first substrate is folded along the fold lines between the two deployment plates, and a deployed configuration in which the flexible first substrate extends substantially flat between the two deployment plates, said plates being apart from each other, and
    the connection device is integrated into one of the deployment plates.

8. The solar generator according to claim 1, wherein at least two of the first electrically conductive traces comprise a first end suitable for connection to the connection device, a second end connected to a chain of cells, and an intermediate portion extending between the ends, all of the intermediate portions of the traces extending in parallel along the main dimension of the solar generator.

9. The solar generator according to claim 1, further comprising a spacer attached to the flexible first substrate and adjacent to each photovoltaic module, the spacer projecting from the flexible first substrate to a greater height relative to said flexible first substrate than the height of a photovoltaic module.

10. A satellite, comprising at least one solar generator according to claim 1.

11. A method for manufacturing a solar generator according to claim 1, comprising:
    the manufacture of at least two modules, and the attachment of each module to a face of an electrically insulating flexible first substrate of a first printed circuit board comprising said flexible first substrate and first electrically conductive traces,
    wherein the manufacture of each module comprises the following steps:
    bonding at least two chains of photovoltaic cells, each chain comprising a plurality of photovoltaic cells connected in series, on a second printed circuit board comprising a second substrate made of electrically insulating material and second electrically conductive traces arranged on a face of the second substrate, by means of a first layer of adhesive material,
    connecting the chains of photovoltaic cells to the second electrically conductive traces,
    bonding a protective layer that is optically transparent within a range of wavelengths corresponding to the cells' range of photovoltaic conversion, on the second printed circuit board and cells, so that it covers all of the cells and second conductive traces of the second printed circuit board, by means of a second layer of adhesive material, and
    vacuum laminating together the second printed circuit board, the chains of photovoltaic cells, and the protective layer.

12. The method according to claim 11, wherein the connection step is implemented by electric or ultrasonic welding.

* * * * *